United States Patent [19]
Goto et al.

[11] Patent Number: 5,280,195
[45] Date of Patent: Jan. 18, 1994

[54] TIMING GENERATOR

[75] Inventors: Masaharu Goto, Saitama; Koh Murata; Nobuyuki Kasuga, all of Tokyo, Japan

[73] Assignee: Hewlett Packard Company, Palo Alto, Calif.

[21] Appl. No.: 837,350

[22] Filed: Feb. 14, 1992

[30] Foreign Application Priority Data

Feb. 22, 1991 [JP] Japan .................. 3-50608

[51] Int. Cl.$^5$ .................................... H03K 01/17
[52] U.S. Cl. .................... 307/269; 307/602; 307/595
[58] Field of Search ............ 307/269, 595, 602

[56] References Cited
U.S. PATENT DOCUMENTS

| | | | |
|---|---|---|---|
| 4,623,805 | 11/1986 | Flora et al. | 307/602 |
| 4,719,365 | 1/1988 | Misono | 307/269 |
| 4,845,437 | 7/1989 | Mansur et al. | 307/269 |
| 4,967,110 | 10/1990 | Matsuura | 307/602 |
| 5,220,206 | 6/1993 | Tsang et al. | 307/602 |

*Primary Examiner*—William L. Sikes
*Assistant Examiner*—Scott A. Ouellette
*Attorney, Agent, or Firm*—Woodcock Washburn Kurtz, Mackiewicz & Norris

[57] ABSTRACT

A timing generator having no dead time and capable of altering a timing at any time. A rough timing pulse generating means suitably specifies one of a plurality of input clock pulses to generate a rough timing pulse for a desired timing. A timing vernier delays the rough timing pulse for a suitable delay time to generate a minute timing pulse. In a compensating circuit, the minute timing pulse is input to a delay circuit having one input terminal and plural output terminals, and one of the outputs at the output terminals for delay is selected by a multiplexer. When the multiplexer selects an output whose delay time is not zero, a next pulse can be input from the timing vernier to the dead time compensating circuit so that no dead time occurs.

12 Claims, 7 Drawing Sheets

TIMING GENERATOR

FIELD OF THE INVENTION

This invention relates to a timing generator for use in various kinds of digital equipment such as a digital-to-analog converter, a function generator and the like, and more particularly, to a timing generator capable of generating at any time a pulse of any desired timing with substantially no accompanying dead time and of suitably altering the timing as the occasion demands.

BACKGROUND OF THE INVENTION

Conventionally, a timing generator having a timing vernier has been utilized for generating a pulse of a desired timing and suitably altering the timing as the occasion demands. In this type of timing generator, a period clock is ordinarily supplied to the generator, and a desired timing pulse is generated at the instant when a predetermined time has elapsed from an edge of the period clock.

FIG. 1 shows a conventional timing generator having such a timing vernier. The timing generator shown in FIG. 1 comprises a counter 1 which receives a period clock PC and a master clock MC, and a timing vernier 2, connected to the counter 1 in series, for delaying an output signal of the counter 1 for a suitable delay time and outputting the delayed signal therefrom. The counter 1 counts the master clock MC whose cycle (frequency) is an integer multiple of a cycle (frequency) of the period clock PC every period (i.e., the time interval between successive or neighboring period clocks). The timing vernier 2, on the other hand, is a timing-variable delay capable of delaying any pulse in a period for a desired time.

In the timing generator as shown in FIG. 1, a non-minute timing (rough timing) is determined by the counter 1 on the basis of the time interval of the master clock MC and a fine timing (a minute timing) is further determined on the basis of a delay time which is set by the timing vernier 2. Thus, a desired timing pulse is obtained on the basis of a combination of the rough timing and the minute timing.

The timing data which are set in the counter 1 and the timing vernier 2 are both rewritten every period clock PC by a timing data latch 3, and a desired timing pulse is generated while the timing is altered every period. That is, a train of period clocks PC and a train of master clocks MC whose cycle is an integer multiple of the cycle of the period clock PC are input to the counter 1. One or more of the input master clocks MC for actuating the timing vernier 2 is specified for every input of clocks PC and MC, and then the specified master clock MC (or the specified number of periods of master clock MC) is outputted to the timing vernier 2. In the timing vernier 2, delay-time data is loaded in accordance with the specified number of periods of the master clock MC needed to output a desired timing pulse with a predetermined time delay. In the conventional timing generator as described above, if the counter 1 and particularly the timing vernier 2 are ideally actuated, a pulse can be generated at a desired timing as described above so that "timing on the fly" can be attained.

However, it is practically impossible to set a delay time (a time elapsed between input and output operations of a pulse) of the timing vernier 2 to zero. In other words, the minimum delay time between the input and output operations of the timing vernier 2 has a positive finite value. Therefore, the conventional timing generator using the timing vernier has a disadvantage that the minimum delay time as described above degrades the performance of the timing generator as a dead time, and, as a result, a pulse is not necessarily generated at a desired timing.

An example of this dead time is illustrated in FIG. 2. As shown, a desired edge A is generated at a time point near to the end of a span (time interval of delay) TVS1 of the timing vernier which is set for a last master clock MC pulse in a period, and another desired edge B is generated within a next span (next time interval of delay) TVS2 of the timing vernier which is set for a first master clock MC in the next period. In addition, the edge A is generated after the first master clock MC in the next period for the edge B is formed. In this case, the timing vernier 2 is entirely devoted or exclusively used for the formation of the edge A until the edge A is formed and outputted. This devotion or exclusive use of the timing vernier 2 causes a dead time as represented by the minimum delay time TVmin in FIG. 2 during which the master clock MC for forming the edge B cannot be input to the timing vernier 2. For reference, TVmax and tA and tB represent the maximum delay time which can be set in the timing vernier 2 and delay times of the timing vernier 2, respectively.

The present invention has been proposed to overcome the above mentioned problems and has an object to provide a timing generator using a timing vernier in which substantially no dead time occurs and the timing can be altered at any time.

SUMMARY OF THE INVENTION

In order to attain the above object, the timing generator according to the invention includes means (hereinafter referred to as "rough timing pulse generating means") for suitably specifying one of the input clock pulses for generating a rough timing pulse at a desired timing and a timing vernier for receiving and suitably delaying the rough timing pulse to generate a minute timing pulse. The invention further includes a compensation circuit disposed at a rear stage of the timing vernier or at a front stage of the rough timing pulse generating means and comprises a circuit serving as a delay circuit having one input terminal and plural output terminals, where the delay time is different between the output terminals, and a multiplexer for selecting one of the output terminals of the delay circuit.

BRIEF DESCRIPTION OF THE DRAWINGS

These and other objects and advantages of the invention will become more readily apparent in view of the following detailed description taken in conjunction with the attached drawings, of which.

DETAILED DESCRIPTION OF THE INVENTION

Figure 1:
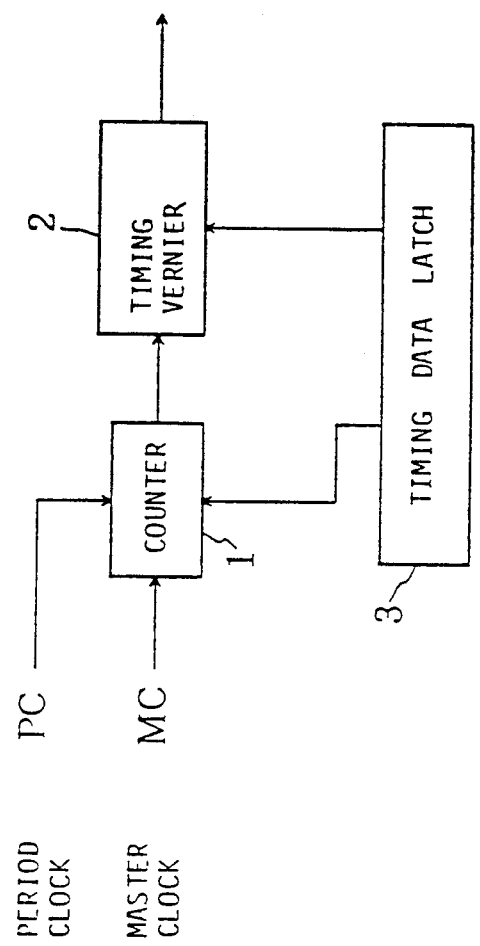
FIG. 1 is a block diagram of a conventional timing generator using a timing vernier.

The present invention will now be described in detail with reference to FIGS. 3-7 where like reference numerals correspond to like elements. Those skilled in the art will appreciate that the embodiments are shown for explanatory purposes only and are not intended to in any way limit the scope of the invention. The scope of the invention may instead be determined by referring to the appended claims.

In this invention, the rough timing pulse generating means is supplied with clock pulses at a constant timing and specify a suitable pulse of the clock pulses for generating a rough timing pulse at a desired timing. For example, period clocks and master clocks whose frequency is an integer multiple of the frequency of the period clocks are input to the rough timing pulse generating means. The rough timing pulse generating means is provided with a function of counting the master clocks. Every input of each period clock to the rough timing pulse generating means as well as a number of a master clock for actuating the timing vernier is specified, and then the specified master clock is outputted to the next stage. A rough timing pulse is generated in the manner as described above.

The rough timing pulse is outputted to the timing vernier. Upon reception of the rough timing pulse, the timing vernier loads delay time data. Like the conventional timing generator, the delay time of the timing generator has a lower limit (minimum delay time), and thus it is impossible to set the delay time below a predetermined time.

A pulse which is generated in the timing vernier is outputted to a dead time compensating circuit comprising a delay circuit (one-input and plural-output delay circuit) which has one input terminal and plural output terminals whose delay time is different among the output terminals, and a multiplexer for selecting one of the outputs at the output terminals. In the dead time compensating circuit, delayed pulses having various delay times (ordinarily, including a pulse whose delay time is zero) are first generated by the one-input and plural-output delay circuit. One of these delayed pulses is selected by the multiplexer. For example, for a certain output pulse of the timing vernier, the multiplexer selects a pulse whose delay time is zero so that such a timing pulse outputted from the timing vernier is outputted through the compensating circuit as a minute timing pulse with no delay time. On the other hand, for another output pulse of the timing vernier, the multiplexer selects a pulse whose delay time is larger than zero so that such a timing pulse outputted from the timing vernier is further delayed by the dead time compensating circuit and then is outputted as a minute timing pulse. When the multiplexer outputs a pulse whose delay time is not zero, the next pulse can be outputted from the timing vernier and thus substantially no dead time occurs. Therefore, in this case, the "timing on the fly" performance can be effectively used.

Further, in the timing generator of this invention, the dead time compensating circuit may be disposed at a front stage of the rough timing pulse generating means. In this case, like the timing generator as described above, the dead time compensating circuit includes a delay circuit which has one input terminal and plural output terminals and whose delay time is different between the output terminals, and a multiplexer for selecting one of the output terminals of the delay circuit. In addition, clock pulses are supplied to the delay circuit, and plural pulses having different delay times are generated in the delay circuit. The pulses generated in the delay circuit also may include a pulse of zero delay time or include no pulse of zero delay time.

These pulses are input to the multiplexer by which one of the pulses is selected and outputted to the rough timing pulse generating means. The rough timing pulse generating means specifies a suitable pulse and outputs the specified pulse to the timing vernier. The timing vernier delays the input pulse for a suitable delay time and generates a desired timing pulse. In such a timing generator, the dead time compensating circuit converts the input clock pulses to plural new master clocks having different timings, and then outputs the master clocks to the rough timing pulse generating means. These new master clocks serve to increase a cycle of the input clock pulses to be input to the rough timing pulse generating means. Therefore, it is possible that a suitable clock pulse is delayed and outputted as a minute timing pulse after the occupation of a just prior rough timing pulse in the timing vernier is completed, thereby generating a next desired timing pulse.

For an embodiment in which the dead time compensating circuit is disposed at the rear stage of the timing vernier, it is presumed that time accuracy of the delay circuit would be reduced in accordance with its frequency characteristic because pulses input to the delay circuit have no periodicity. In such a case, the timing generating having the dead time compensating circuit disposed at the front stage of the rough timing pulse generating means is used. This is because when the dead time compensating circuit is disposed at the front stage of the rough timing generating means, pulses of masters clocks to be input to the rough timing generating means have periodicity so that no problem due to reduction of the time accuracy occurs.

Figure 3:
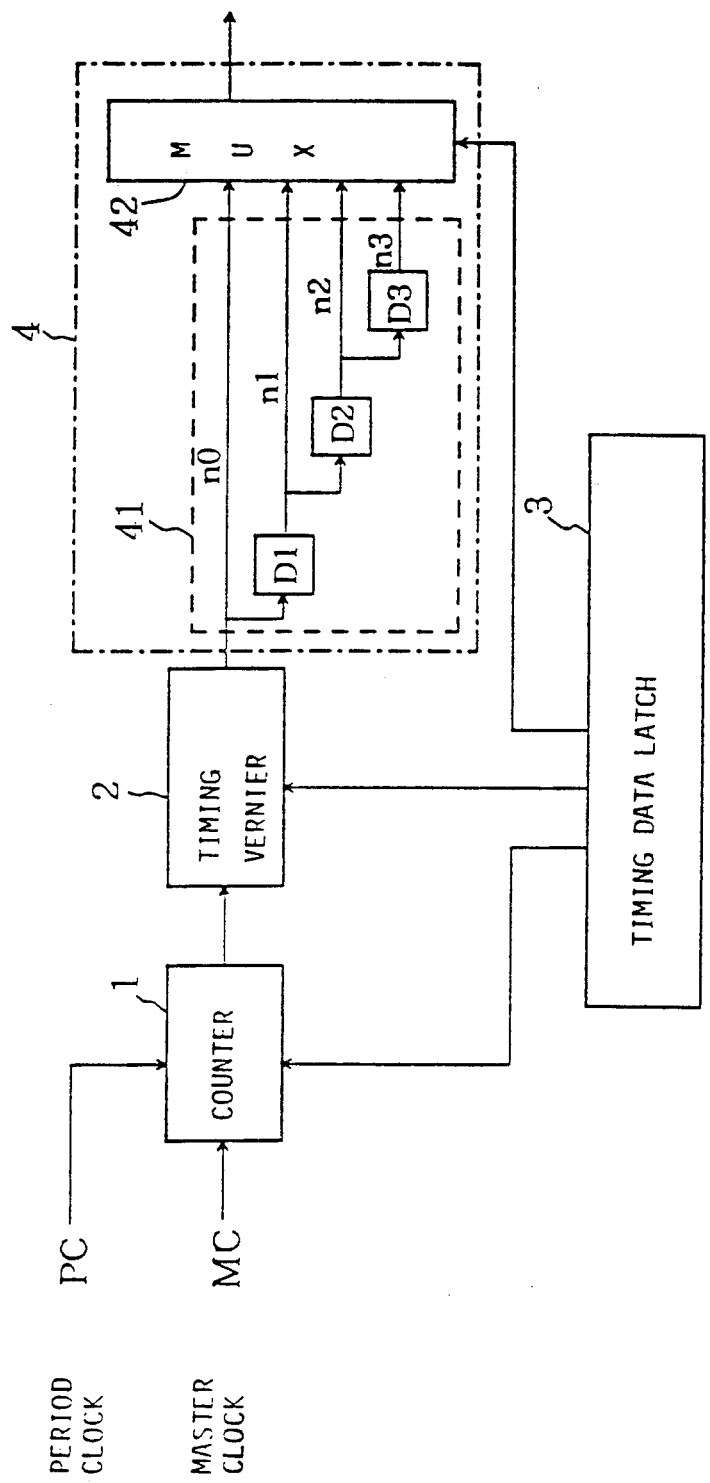
FIG. 3 is a block diagram of a first embodiment of the timing generator according to this invention in which a dead time compensating circuit is disposed at a rear stage of the timing vernier.
Figure 4:
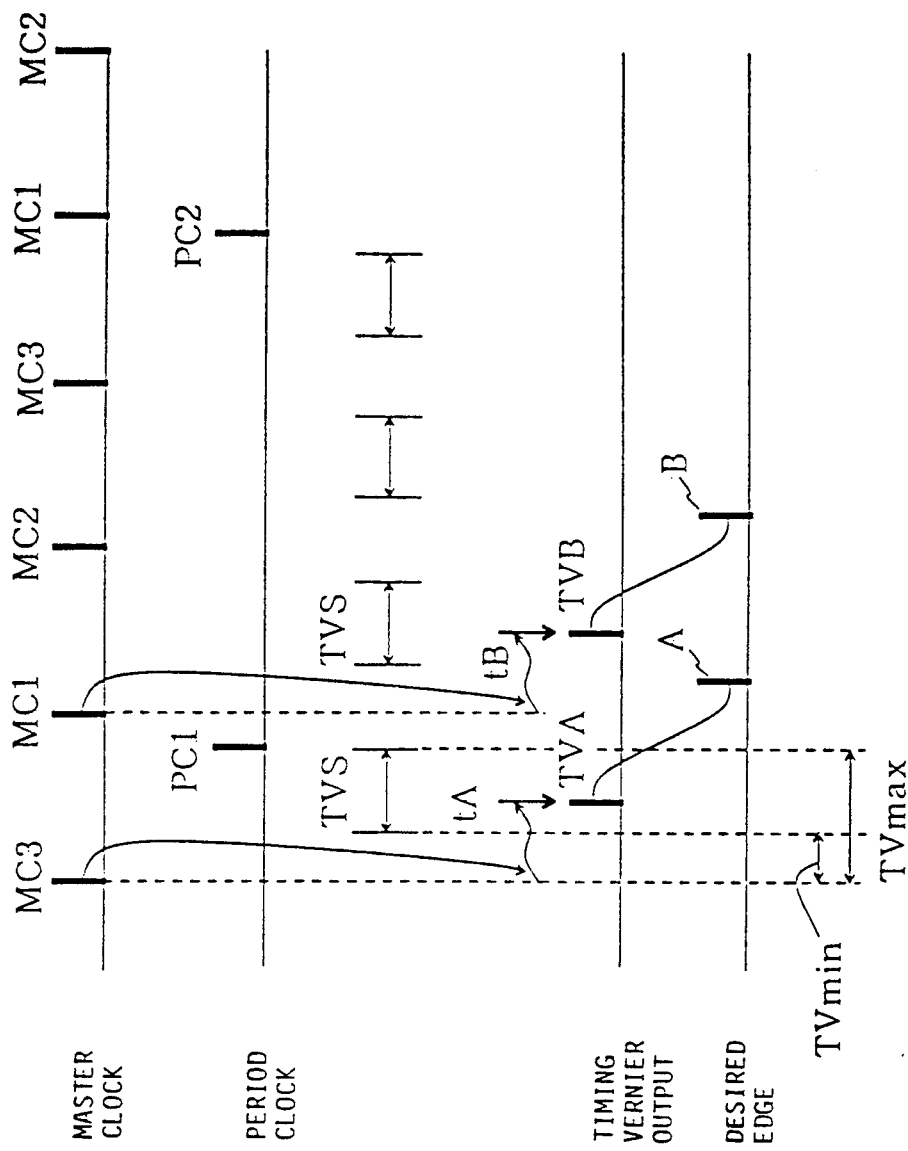
FIG. 4 is a time chart for pulse waveforms of each part constituting the timing generator of the embodiment of FIG. 3.

FIG. 3 is a circuit diagram for an embodiment of the timing generator according to this invention, wherein a dead time compensating circuit 4 is disposed at a rear side of a timing vernier 2, and FIG. 4 illustrates a time chart of the operation of the circuit of FIG. 3. In FIG. 3, a counter 1 serves as a rough timing pulse generating means and is supplied with a period clock PC and a master clock MC. The master clock MC is a pulse whose cycle is an integer multiple (three times in this embodiment) of a cycle of the period clock PC. Upon input of the period clock PC to the counter 1, a timing data latch 3 specifies the pulse of master clock MC to be outputted to the timing vernier 2. The counter 1 counts the master clock MC and then outputs the specified pulse of master clock MC to the timing vernier 2 as a rough timing pulse. In this case, the pulse of master clock MC to be outputted to the timing vernier 2 in each period can be individually set by the timing data latch 3 every period.

The timing vernier 2 delays the input rough timing pulse for a suitable delay time on the basis of delay time data loaded from the timing data latch 3 and then outputs the delayed pulse to the dead time compensating circuit 4. This delayed time can also be individually set by the timing data latch 3 for every rough timing pulse input to the timing vernier 2.

The dead time compensating circuit 4 comprises a delay circuit 41 having one input terminal and plural output terminals and a multiplexer 42. The delay circuit 41 outputs plural (four in FIG. 3) delayed outputs to the multiplexer 42. In FIG. 3, the delay circuit 41 includes a path n0 in which a pulse is not delayed and three paths n1 to n3 in which three kinds of delays D1 to D3, respectively, are provided. The multiplexer 42 selects any one of these delay paths and outputs a pulse passing through one of the paths as a minute timing pulse. Here, the selection of the multiplexer 42 is suitably controlled by the timing data latch 3 for every period clock PC.

The operation of the timing generator as shown in FIG. 3 now will be described with reference to FIG. 4. The following description is made representatively for a case where two edges A and B which are near to each other are formed by the timing generator of this embodiment.

Upon input of a period clock PC0 (not shown in FIG. 4) to the counter 1, the timing data latch 3 specifies a last master clock MC3 (a first MC3 in FIG. 4) in the period clock PC0, and the counter 1 outputs the specified MC3 as a rough timing pulse to the timing vernier 2. Upon reception of the rough timing pulse, the timing vernier 2 loads delay-time data from the timing data latch 3 to generate a delayed pulse TVA (represented as an output of timing vernier 2 in FIG. 4), and then outputs the delayed pulse to the delay circuit 41 of the dead time compensating circuit 4. The delay circuit 41 outputs a pulse having no delay time through the path n0 and pulses having delay times D1 to D3 through the paths n1 to n3, respectively. The delay times D1 to D3 are predetermined fixed values.

The timing data latch 3 controls the compensating circuit 4 to select one of the paths n0 to n3 so that an output pulse of the compensating circuit 4 has the same timing as the desired edge A, and outputs the pulse as a minute timing pulse. For example, in FIG. 4, the output of the dead time compensating circuit 4 is coincided with that of the desired edge A by suitably adjusting a delay time tA of the timing vernier 2 and suitably selecting one of the paths n0 to n3 to adjust the time interval between TVA and A in FIG. 4.

Figure 2:
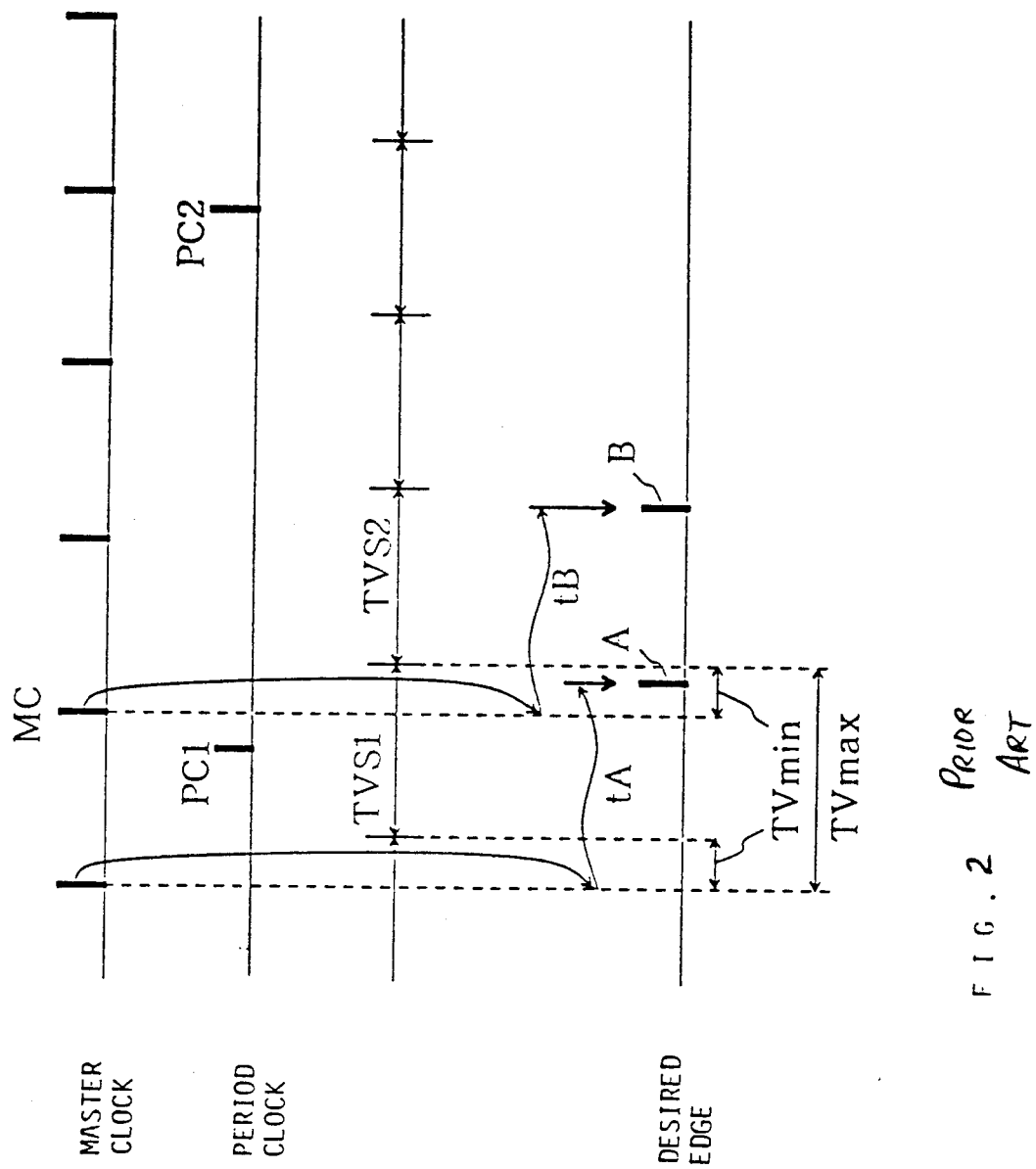
FIG. 2 is a time chart for pulse waveforms of each part constituting the conventional timing generator of FIG. 1.

Next, upon reception of the period clock PC1, the counter 1 outputs the master clock MC1 to the timing vernier 2 in response to a signal from the timing data latch 3. The time at which the master clock MC1 of the counter 1 is input to the timing vernier 2 is prior to output of the desired edge A from the dead time compensating circuit 4 as shown in FIG. 4. However, when the desired edge A is about to be outputted, there absolutely exists a time area for which the timing vernier 2 is not occupied because of the delays D1 to D3 so that a master clock for loading the delay time data by the timing vernier 2 can be surely obtained. That is, even when the timing vernier 2 is occupied by MC1, the delays D1 to D3 are operated independently of the timing vernier 2, and thus the disadvantage due to the dead time of the conventional timing generator as show in FIGS. 1 and 2 does not occur in this embodiment. In FIG. 4, TVS, TVmin and TVmax represent a span of the timing vernier 2, the minimum delay time and the maximum delay time, respectively.

Accordingly, in the case of formation of the edge B, in the same manner as described above the master clock MC1 is delayed for a delay time tB by the timing vernier 2 and then outputted as a pulse TVB to the dead time compensating circuit 4. Thereafter, the pulse TVB is outputted through the delay circuit 41 to the paths n0 to n3, and the multiplexer 42 selects any one of the paths n0 to n3 to output a pulse which is coincident with the desired edge B.

Figure 5:
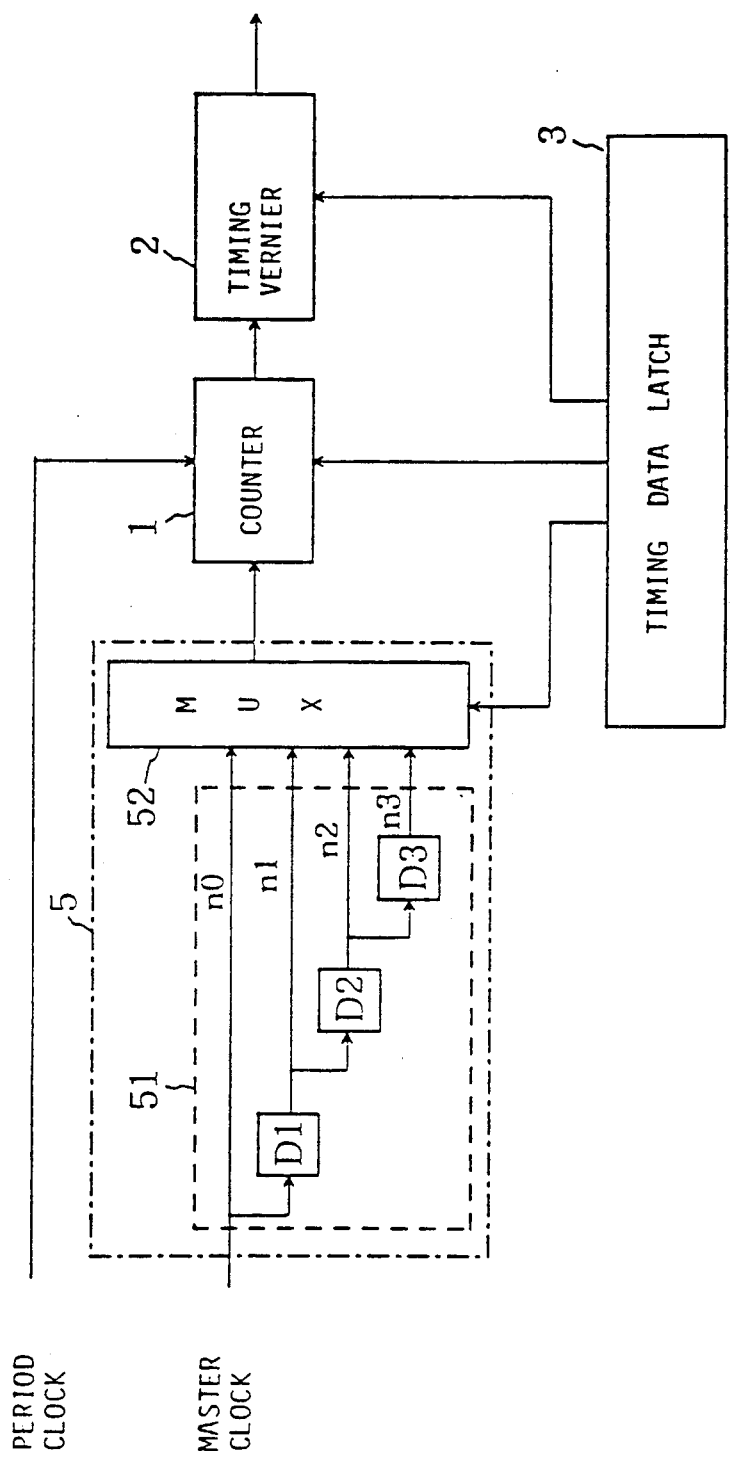
FIG. 5 is a block diagram illustrating another embodiment of the timing generator according to this invention in which the dead time compensating circuit is disposed at the front stage of the rough timing generating means.
Figure 6:
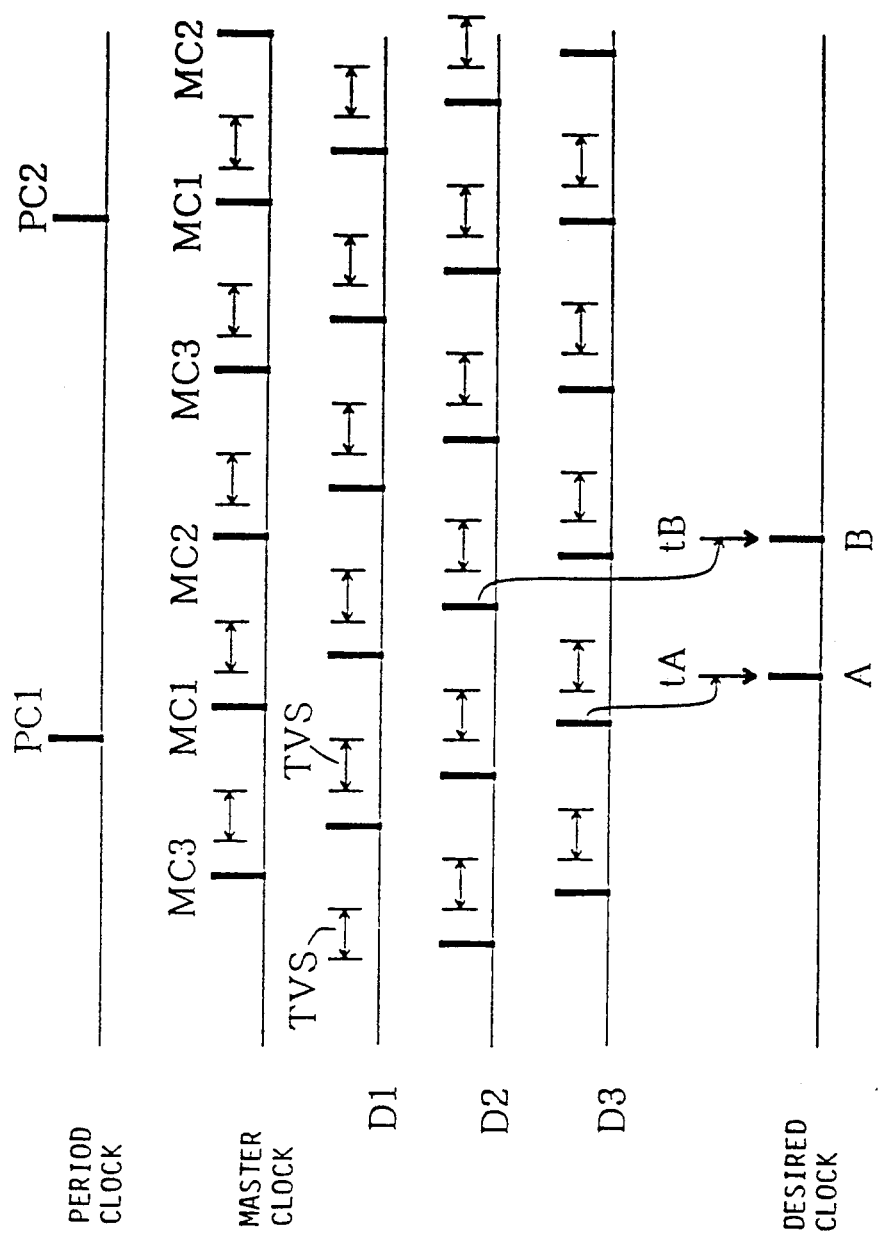
FIG. 6 is a time chart for pulse waveforms of each part constituting the timing generator of the embodiment of FIG. 5.

FIG. 5 is a circuit diagram for an embodiment of the timing generator according to this invention in a case where the dead time compensating circuit is disposed at a front stage of the counter 1 serving as the rough timing pulse generating means. FIG. 6 illustrates a time chart of the operation of the circuit of FIG. 5. In FIG. 5, a dead time compensating circuit 5 having the same construction as the dead time compensating circuit 4 is provided at the front stage of the counter 1. At a next stage of the timing generator is ordinarily disposed equipment or the like which practically uses a timing pulse generated in the timing generator. In general, an output timing pulse of the timing generator is restricted in time interval by the equipment. In such a case, if the dead time of the timing generator is shorter than the minimum time interval of the timing pulse which is restricted by the equipment or the like, there never occurs a problem that a next pulse can not be outputted because a pulse occupies the timing vernier 2. The timing generator as shown in FIG. 5 is thus preferably applied to a case where a delay of the timing vernier 2 which can be set to the minimum value is shorter than the minimum time interval of the timing pulse which is restricted by the equipment or the like.

The operation of the timing generator as shown in FIG. 5 will be described with reference to FIG. 6. In FIG. 5, master clocks having respective phases are input to the delay circuit 51, the respective phases being relatively shifted by a time interval shorter than a difference time between the minimum time interval of the timing pulse which is restricted by the equipment or the like and the delay time of the timing vernier 2 which can be set to the minimum value, to thereby form plural paths corresponding to the four paths in FIG. 3. The dead time compensating circuit 5 is so designed that a time difference between the earliest output and the latest output of the outputs of the paths thus formed is longer than the minimum time interval as described above, and one of the outputs of the delay circuit 51 is suitably selected by the multiplexer 52. The paths of the delay circuit 51 includes a path having a zero delay time.

Next, in FIG. 6, the path n3 from the delay D3 based on a master clock MC3 in a period clock PC0 (not shown) is selected by the multiplexer 52 to output the signal D3 to the counter 1 as a new master clock. The counter 1 outputs the signal D3 to the timing vernier 2 as a rough timing pulse, and the timing vernier 2 delays the signal D3 for a suitable delay time to output a minute timing pulse which corresponds to the desired edge A. Before the above minute timing pulse based on the master clock MC3, a master clock MC1 in a period clock PC1 is input to the dead time compensating circuit 5. At this time, a processing for forming the desired edge A has been already transferred to the timing vernier 2. Therefore, there never occurs a case where the processing for forming the edge A disturbs a processing for the desired edge B. In FIG. 6, TVS and tA, tB represent a span of the timing vernier 2 and delay times, respectively, as shown in FIG. 4.

Figure 7:
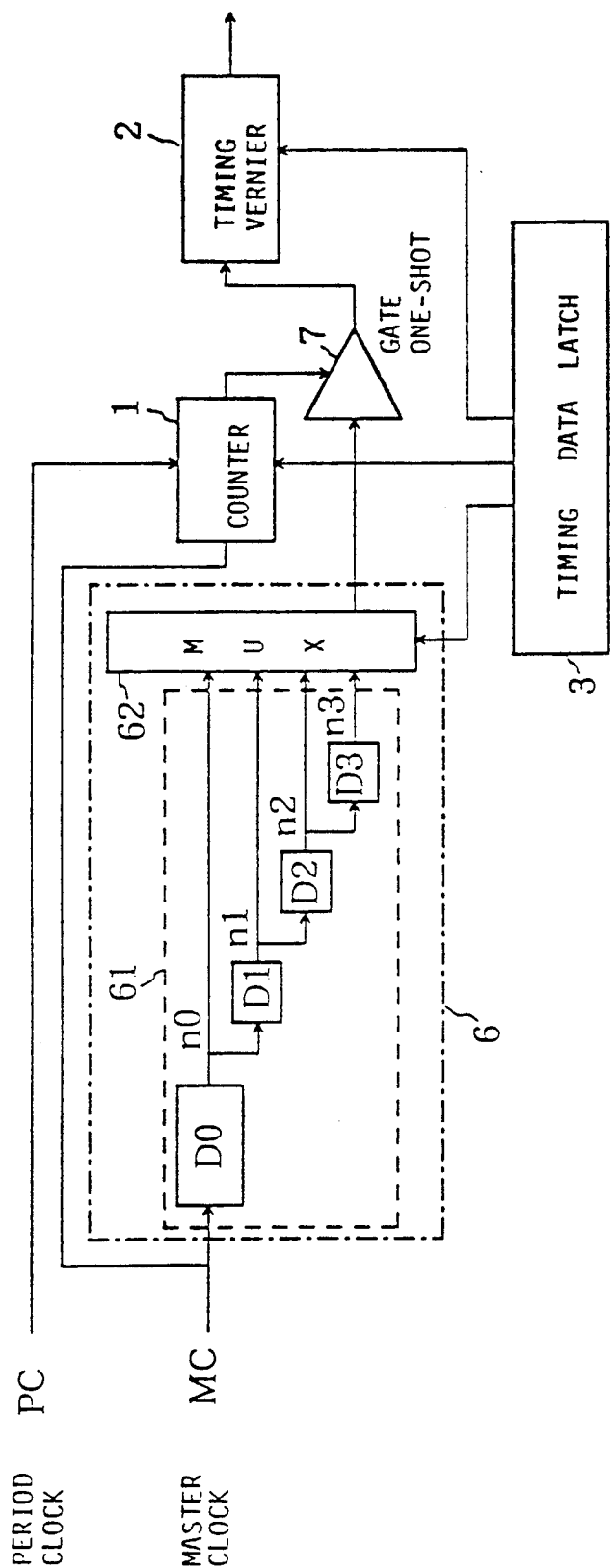
FIG. 7 is a block diagram illustrating yet another embodiment of the timing generator according to the invention.

FIG. 7 is a circuit diagram of another embodiment which improves the supply method of supplying a start signal to the timing vernier 2 in the timing generator as shown in FIG. 5. In FIG. 7, plural paths n0 to n3 of the delay circuit 61 of the dead time compensating circuit 6 are provided with the delays D0 to D3, respectively. The rough timing pulse generating means includes the counter 1 and further includes a gate one-shot 7 which is switched on by a signal from the counter 1. The master clock MC is directly input to the counter 1, not through the dead time compensating circuit 6. An output of the multiplexer 62 of the dead time compensating circuit 6 is supplied through the gate one-shot 7 to the timing vernier 2.

As a result, the timing vernier 2 is actuated not by a signal from the counter 1, but by a signal (one of the signals D0 to D3) from the multiplexer 62 which is gated through the gate one-shot 7 with the signal from the counter 1. In the timing generator as shown in FIG. 5, the counter 1 counts master clocks MC having various phases so that it is difficult to perform phase-control of the period clocks PC and the master clocks MC for determining timings at which the timing data is loaded to the counter 1 and the multiplexer 52. On the other hand, in the timing generator as shown in FIG. 7, the counter 1 is actuated by the original master clocks MC having invariable phase, and thus the phase-control is easily performed.

The following effects can be obtained by the timing generator of this invention.

(1) Since no dead time occurs, a desired timing pulse can be obtained, and in addition, the timing of the pulse can be altered at any time so that "timing on the fly" performance can be used.

(2) By providing the delay circuit to plural output terminals, it is not required for the timing vernier to cover the whole cycle of the timing clock. As a result, the span of the timing vernier can be set to be more narrow, and time setting resolution for a timing can be improved.

(3) In a case where the dead time compensating circuit is disposed at the front stage of the rough timing pulse generating means, since a pulse to be input to the rough timing pulse generating means is a periodic signal, a delay time is constant for every delay line, and thus the time accuracy can be improved. Further, in a case where plural timing generators are used in a system to generate plural timing pulses, one delay circuit may be commonly used between the timing generators so that the manufacturing cost can be reduced.

Those skilled in the art will appreciate that minor modifications may be made within the scope of the invention without departing from the scope of the attached claims.

What is claimed is:

1. A timing generator for generating a desired timing signal in response to a master clock signal, comprising:
   means responsive to said master clock signal for generating a rough timing pulse as an approximation to said desired timing signal;
   first timing means responsive to said rough timing pulse for delaying said rough timing pulse so as to more closely approximate said desired timing signal; and
   second timing means independent of said first timing means which is responsive to said delayed rough timing pulse for further delaying said rough timing pulse so as to generate said desired timing signal, said second timing means comprising an input terminal, a plurality of output terminals, a plurality of delays and a selector, said input terminal being connected to said plurality of delays and output terminals so as to provide a plurality of delay paths, whereby said selector is operated to select a one of said delay paths which substantially eliminates a dead time.

2. A timing generator according to claim 1 further comprising data latching means for independently controlling said first and second timing means in accordance with timing data.

3. A timing generator according to claim 2 wherein said data latching means controls said first timing means to generate a next desired timing signal while said second timing means is generating a current desired timing signal.

4. A timing generator according to claim 1 wherein one of said plurality of said delay paths has a substantially zero delay for substantially eliminating said dead time.

5. A timing generator for generating a desired timing signal in response to a master clock signal, comprising:
   first timing means responsive to said master clock signal for delaying said master clock signal so as to generate a delayed timing pulse as an approximation to said desired timing signal, said first timing means comprising an input terminal, a plurality of output terminals, a plurality of delays and a selector, said input terminal being connected to said plurality of delays and output terminals so as to provide a plurality of delay paths;
   means responsive to said delayed timing pulse for generating a rough timing pulse as a more close approximation to said desired timing signal; and
   second timing means responsive to said rough timing pulse for further delaying said rough timing pulse so as to generate said desired timing signal, whereby said selector selects one of said delay paths which generates a delayed timing pulse which causes a dead time to be substantially eliminated.

6. A timing generator according to claim 5 wherein said master clock is a non-periodic signal.

7. A timing generator according to claim 5 further comprising data latching means for independently controlling said first and second timing means in accordance with timing data.

8. A timing generator according to claim 7 wherein said data latching means controls said first timing means to generate a next desired timing signal while said second timing means is generating a current desired timing signal.

9. A timing generator according to claim 5 wherein one of said plurality of said delay paths has a substantially zero delay for substantially eliminating said dead time.

10. A timing generator according to claim 7 wherein said rough timing pulse generating means comprises a counter responsive to said master clock signal for generating a rough timing pulse and a one-shot gate responsive to said delayed timing signal, said rough timing pulse controlling loading of said one-shot gate to pass an output of said one-shot gate to said second timing means in accordance with said timing data.

11. A method of substantially eliminating a dead time during the generation of a desired timing signal from a master clock signal, comprising the steps of:
- a) generating a rough timing pulse in response to said master clock signal as an approximation to said desired timing signal;
- b) delaying said rough timing pulse so as to more closely approximate said desired timing signals;
- c) delaying said delayed rough timing pulse so as to generate said desired timing signal, comprising the steps of:
  - i) delaying said delayed rough timing pulse in different delay paths by different amounts of time, and
  - ii) selecting an output of one of said delay paths which most closely approximates said desired timing signal; and
- d) controlling step b) independent of step c), whereby a combined delay in steps a)–c) causes said dead time to be substantially eliminated.

12. A method of substantially eliminating a dead time during the generation of a desired timing signal from a master clock signal, comprising the steps of:
- a) delaying said master clock signal in different delay paths by different amounts of time so as to generate a plurality of delayed timing pulses;
- b) selecting one of said plurality of delayed timing pulses as an approximation to said desired timing signal;
- c) generating a rough timing pulse in response to said one delayed timing pulse as a more close approximation to said desired timing signal;
- d) further delaying said rough timing pulse so as to generate said desired timing signal; and
- e) controlling steps a) and b) independent of step c), whereby a combined delay in steps a)–d) causes said dead time to be substantially eliminated.

* * * * *